United States Patent [19]

Polacek et al.

[11] Patent Number: 5,702,213
[45] Date of Patent: Dec. 30, 1997

[54] RETRACTABLE REGISTRATION PIN APPARATUS

[75] Inventors: Richard Polacek, Santa Barbara; Dan Popovich, Adelanto, both of Calif.

[73] Assignee: Excellon Automation Company, Torrance, Calif.

[21] Appl. No.: 653,208

[22] Filed: May 24, 1996

[51] Int. Cl.$^6$ .................. B23Q 3/02; B23Q 3/18
[52] U.S. Cl. .................. 409/218; 269/304; 269/320; 408/87
[58] Field of Search .................. 269/303, 304, 269/315, 316, 320; 408/87; 409/218

[56] References Cited

U.S. PATENT DOCUMENTS

| | | | |
|---|---|---|---|
| 2,934,040 | 4/1960 | Blatt et al. | 269/320 |
| 4,593,450 | 6/1986 | Dumire | 409/218 |
| 4,880,218 | 11/1989 | Greene | 269/315 |

*Primary Examiner*—Steven C. Bishop
*Attorney, Agent, or Firm*—Henry G. Kohlmann

[57] ABSTRACT

A retractable registration pin to be used on the tooling plate of a printed wire board drilling machine for alignment of PWB panels on the tooling plate for drilling. In the instant invention, a soft plug which receives a registration pin is mounted on a spline shaft. The bottom of the ball spline shaft is attached to a link which is coupled to a pneumatic cylinder. The pneumatic cylinder is driven by a pneumatic valve which raises and lowers the registration pin on the ball spline assembly. The pneumatic cylinder may either fully retract the registration pin to a position below the surface of the tooling plate, or fully extend the ball spline shaft so that the upper surface of the soft plug holding the registration pin, is parallel to and lies in the same plane as the upper surface of the tooling plate. When the registration pin is in the raised position, work panels may be placed over the registration pin until a suitable number have been prepared for drilling. If the registration pin protrudes above the surface of the upper work panel work piece, a pneumatic valve is opened allowing the pneumatic cylinder to be opened to the atmosphere and the spindle of the machine tool may be used to push down the registration pin to a position that is flush with the surface of the upper work piece, thereby preventing interference with the spindle. When drilling of the panels is completed, the pneumatic valve may be engaged again, to retract the registration pin below the surface of the tooling plate allowing easy removal of the work from the machine.

12 Claims, 2 Drawing Sheets

RETRACTABLE REGISTRATION PIN APPARATUS

BACKGROUND OF THE INVENTION

1. Field of Invention

The field of this invention relates to registration devices used for positioning work pieces on a work table and holding the same in place while the work piece is operated on. More particularly this invention relates to registration pins which are inserted into the tooling plate of the work tables of numeric controlled machine tools to position printed circuit boards and other work pieces for drilling or other machine operations.

2. Related Art

Drilling machines are computer controlled machines having a table which moves in any X,Y plane and a spindle which moves perpendicular to the table in the Z direction to drill holes in the printed circuit boards sometimes called printed wire boards (PWB). On the X,Y table are mounted one or more plates, commonly called tooling plates, on to which stacks of one or more PWBs are placed. Various means are used to register, or align, the PWB on the tooling plate. Many tooling plates use pins which are installed in the plate. Holes are provided in the PWB so that when it is placed onto the tooling plate it registers on the pins and the pins protrude through the holes in the PWB.

Typically the pins are pressed into holes drilled by the machine into removable pieces called "soft plugs." Because the machine drills these holes the pin location is accurate and registration errors are minimized. However, the "soft plug" is screwed into the tooling plate and must be removed if any change in the size of the work piece takes place. Pins are therefore stationary and are normally replaced every time a different size panel is to be drilled.

In addition, the height of the stationary pin creates a problem because if the pin protrudes above the PWB and holes are to be drilled close to the pin the pin may interfere with the housing which surrounds the drill bit and impact drilling accuracy. While shorter pins could be used which do not project above the top of the PWB this pin would have to be changed every time the height of the stack of PWBs was changed. Changing the pin requires removal of the "soft plug," insertion of a new one, drilling the new plug and inserting a new pin.

The stationary pin also makes loading the PWB panel difficult because as a panel is placed over it the pin may be disposed at an angle relative to the PWB not being placed precisely perpendicular to the pin and, therefore, the pin may not enter the hole in the panel easily thereby causing the panel to bend due to the axis of the hole not coinciding but being at an angle to the axis of the pin. If the panel is loaded over the pins manually the operator can compensate for this misalignment. However, if the panel is automatically loaded the loading device may not detect this condition and therefore not compensate for it and a malfunction can occur.

SUMMARY OF THE INVENTION

The present invention is a retractable registration pin to be used on the tooling plate of a printed wire board drilling machine.

A registration pin aligns the PWB panels on the tooling plate. Holes for these pins are typically drilled by the spindle into a soft plug. In the instant invention, the soft plug is mounted on a spline shaft which comprises a preloaded assembly. Commercially available ball spline shafts are suitable for the invention and provide an extremely rigid linear slide. Ball splines use recirculating balls inside the housing to preload the shaft and allow the shaft to move with negligible friction and position error. A ball spline assembly and its housing or guide are mounted inside another housing which is fastened to the tool plate, to hold the entire assembly in fixed position. A soft plug is screwed into the top of the ball spline shaft and a hole for receiving the registration pin is drilled, by the spindle for precise alignment of the registration pin. The bottom of the ball spline shaft is attached to a link which is coupled to a pneumatic cylinder of a conventional type. The pneumatic cylinder is driven by a pneumatic valve which raises and lowers the registration of the ball spline assembly and therefore, the registration pin. The pneumatic cylinder may either fully retract the registration pin to a position below the surface of the tooling plate, or fully extend the ball spline shaft so that the upper surface of the soft plug holding the registration pin, is parallel to and lies in the same plane as the upper surface of the tooling plate. In fact, a number of the retractable registration pin assemblies may be spaced about the tooling plate, to accommodate work of varying sizes, without the need to remove existing previously used registration pins. Rather, they may be simply lowered below the surface of the tooling plate and therefore out of the work area. When the registration pin is in the raised position, work panels may be placed over the registration pin until a suitable number have been prepared for drilling. In the event that the registration pin protrudes above the surface of the upper work panel work piece, the pneumatic valve may be opened allowing the pneumatic cylinder to be opened to the atmosphere and the spindle of the machine tool may be used to push down the registration pin to a position that is flush with the surface of the upper work piece, thereby preventing its interference with drilling by the spindle. When the machine tool has finished drilling the panels, the pneumatic valve may be engaged again, causing the registration pin to retract below the surface of the tooling plate allowing easy removal of the work from the machine.

The object of this invention is to present a simple means for having a movable registration pin which can be pressed even with the top of a stack of printed wire boards thus allowing the drill bit which is the spindle to drill holes very close to the pin.

The present invention consists of preloaded linear bearing mounted in the housing. The housing is attached to the tooling plate. The slide of the linear bearing is moved by a pneumatic cylinder directly or indirectly attached to it. In the top of the linear bearing shaft is the registration pin.

Another feature of this invention is the incorporation of a "soft plug" to make the replacement of the pin easy, efficient and accurate.

Another feature of this invention is the ability for the pin to retract out of the way when a panel is loaded thus improving the reliability of automatically loading a panel.

Still another feature of the invention is the elimination of panel ejectors which normally are used to remove the panel or panels from the registration pin. In the instant invention, such ejectors are not needed because by fully retracting the pin out of the hole in the panel the panel is free of the pin and can be easily removed from the tooling plate.

Consequently, if the pin does not have to be changed but can be depressed into the hole in the PWB so as to register flush with the top of the PWB it would not interfere with the drill bit and time would be saved by eliminating the need to install a new pin.

DETAILED DESCRIPTION OF THE INVENTION

Figure 1:
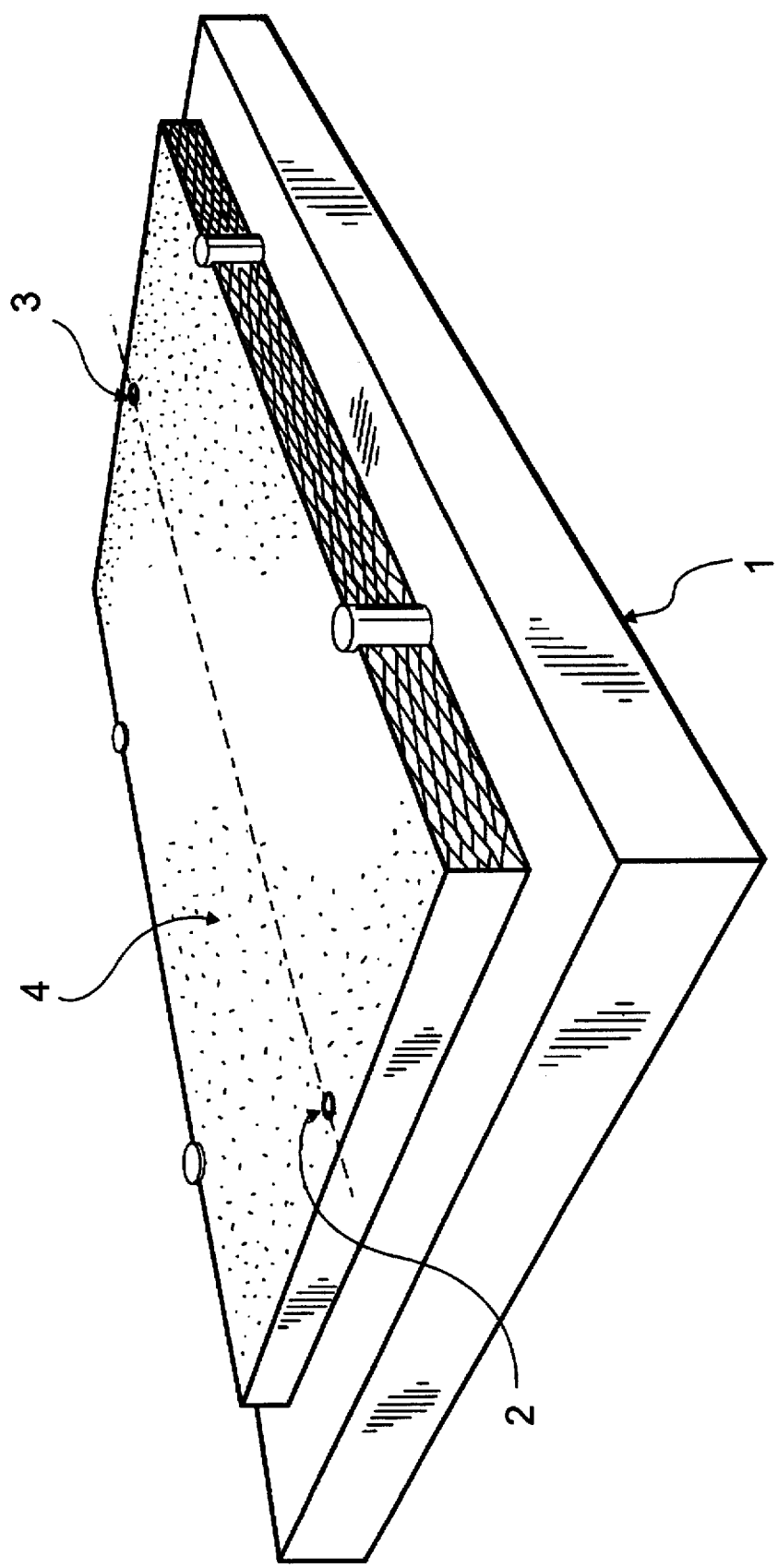
FIG. 1 shows a PWB mounted on a tooling plate with two registration pins.

FIG. 1 shows the tooling plate i having a registration pins 2 and 3 mounted thereon and a PWB 4 registered over the registered pins 2 and 3.

Registration pin 3 aligns the PWB panel in a radial direction about Pin 2. When the PWB 4 is mounted on Pin 2 it may rotate radially unless it is held in position by Pin 3. In this configuration the PWB 4 will remain in place as it is drilled by the numerical controlled machine tool.

Figure 2:
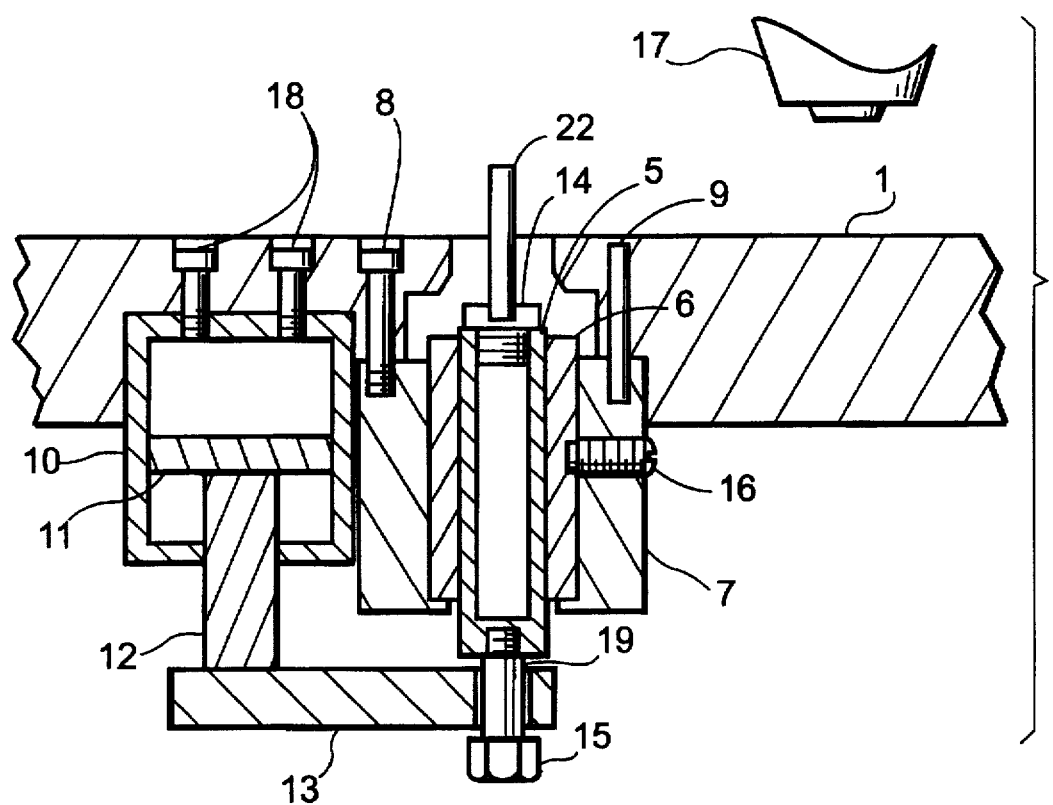
FIG. 2 shows a side view of the retractable pin assembly mounted to a tooling plate

FIG. 2 shows a detailed sectional side view of the various parts of the retractable registration pin assembly. It shows a ball spline shaft 5 which permits precise motion with minimum position error to maintain registration accuracy. Ball splines are commercially available and use recirculating balls inside the housing 6 (not shown) to preload the Shaft and allow the shaft to move with negligible friction and position error. The housing 6 is mounted inside a second outer housing 7, which is fastened to the tooling plate 4 by bolts 8 and a doweling pin 9, and thus is held rigidly in place. Alternatively, it may be made integral with the tooling plate.

A typical pneumatic cylinder 10, having a piston 11 mounted to a piston rod 12, is coupled to the spline shaft 5 by a link 13. The cylinder 10 is also attached to the tooling plate by bolts or screws 18. While a pneumatic cylinder has been described, it is contemplated that any equivalent linear motion device can be used such as an electric solenoid, for example. The upper end of the ball spline shaft 5 receives a "soft plug" 14. The "soft plug" 14 is removable and is screwed into the end of the shaft 5. The bottom of shaft 5 is mounted to the link 13 by a bolt 15 in a noninfluencing coupling.

Figure 3:
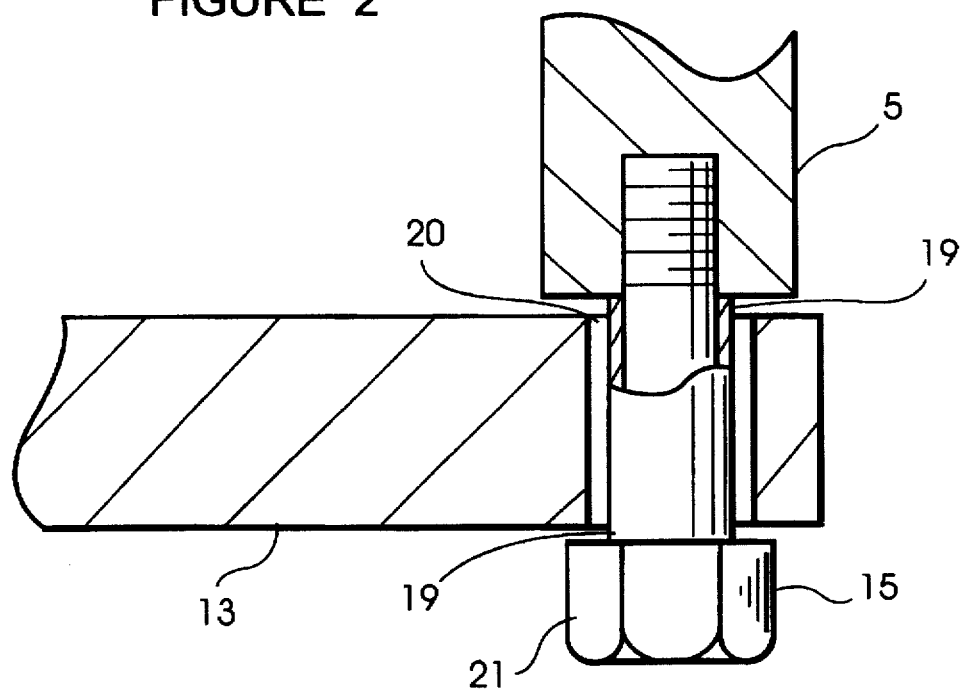
FIG. 3 is a sectional side view of the non-influencing mountings of the ball spline to the link.

FIG. 3 shows the interconnection between the ball spline shaft 5 and the link 13 in more detail.

A non-influencing coupling is desired to prevent binding of the ball spline shaft 5 in the event the alignment of the ball spline shaft 5 and the piston rod 12 are not parallel. That is when the angles between the shaft and the link 13 or the piston rod 11 and the link 13 are not normal (i.e., right angles).

Accordingly, a bolt 15 is inserted through a bushing 19 received by a hole 20 through the link 13. The bushing 19 is longer along the longitudinal axis than the thickness of the link 13.

The outside diameter of the bushing 19 is smaller than the inside diameter of the hole 20 sufficient to permit the bushing 19 to move longitudinally in the hole 20. The bolt is screwed into the bottom of the ball spline shaft 5 until the bushing 19 is held in place. The head 21 of the bolt 15 is larger in width than the diameter of the hole 20 and prevents the link from passing over the head 21.

The diameter of the ball spline shaft 5 is also larger than the hole 20 and cannot pass through the hole 20.

The described structure permits motion of the link 13 relative to the ball spline in both a longitudinal direction along the axis of the ball spline shaft 5 and some lateral motion along the longitudinal axis of the link 13 relative to the ball spline shaft 5. Thus in the event the angles are not normal, a slight amount of slop created by this design will prevent binding of the ball spline shaft 5.

Other equivalent non-influencing designs may be implemented to prevent binding and the design used is not intended to be limited to the structure shown.

Referring again to FIG. 2

A set screw 16 or key (not shown) is installed in the housing 7 to prevent the housing 5 from rotating during insertion and removal of the soft plug 14. In similar fashion the dowel pins 9 are used to prevent the housing 7 from rotating. In operation a pneumatic valve (not shown) controlling air to the cylinder 10 is activated to cause the piston rod 11 to be retracted. With the cylinder retracted the registration pin 16 protrudes above the surface of the tooling plate 4. After one or more panels are placed over the registration pin 16, the pin may protrude above the top of the stack of panels. In such event, the spindle 17 of the drilling machine will be used to press down the pin 16 flush with the upper surface of the top panel. When this occurs, the pneumatic valve is opened to allow both sides of the piston 11 in the cylinder to be connected to atmosphere thus allowing the piston 11 to move freely. In other embodiments of the invention a brake or other engaging means may be used to hold the ball spline shaft 5 in position after being pressed down by the drill spindle 17. For simplicity a brake is not shown in the drawing.

After PWB stack is drilled the pneumatic valve can be reversed to fully extend the piston 11, thereby retracting the registration pin 16 out of the PWB stack allowing for easy removal of the panels from the tooling plate 1.

Having thus described the invention, what is claimed is:

1. A registration apparatus for use with a machine tool having at least one spindle comprising:
   a. a tooling plate having an access hole,
   b. a guide mounted in a fixed position relative to said tooling plate,
   c. a shaft slideably received by said guide adapted for longitudinal movement within said guide,
   d. a collar adapted for removable attachment to one end of said shaft, having a hole in the top thereof,
   e. a registration pin received by said hole in said collar adapted for extending above the surface of said tooling plate on movement of said shaft, and
   f. a linear motion device having a rod, mounted on said tooling plate operatively coupled to said shaft.

2. A retractable registration apparatus as described in claim 1 wherein said shaft may be selectively raised and lowered on energizing or de-energizing of said linear motion apparatus.

3. A registration apparatus as described in claim 2 wherein said linear motion device comprises a pneumatic cylinder having a piston and piston rod.

4. A registration apparatus for use with a machine tool having at least one spindle comprising:
   a. a tooling plate having an access hole,
   b. a guide mounted in a fixed position relative to said tooling plate,
   c. a shaft slideably received by said guide adapted for longitudinal movement within said guide,
   d. a collar adapted for removable attachment to one end of said shaft, having a hole in the top thereof,
   e. a registration pin received by said hole in said collar adapted for extending above the surface of said tooling plate on movement of said shaft, and f. a linear motion device having a rod, mounted on said tooling plate operatively coupled to said shaft through a non-influencing coupling.

5. A registration apparatus for use with a machine tool having at least one spindle comprising:
   a. a tooling plate having an access hole,
   b. a guide mounted in a fixed position relative to said tooling plate,
   c. a shaft slideably received by said guide adapted for longitudinal movement within said guide,
   d. a collar adapted for removable attachment to one end of said shaft, having a hole in the top thereof,
   e. a registration pin received by said hole in said collar adapted for extending above the surface of said tooling plate on movement of said shaft, and
   f. an electrically driven solenoid having a moveable rod, mounted on said tooling plate operatively coupled to said shaft for selectively raising and lowering said shaft on energizing or de-energizing of said solenoid.

6. A registration apparatus for use with a machine tool having at least one spindle comprising:
   a. a tooling plate having an access hole,
   b. a guide mounted in a fixed position relative to said tooling plate,
   c. a shaft slideably received by said guide adapted for longitudinal movement within said guide,
   d. a collar adapted for removable attachment to one end of said shaft, having a hole in the top thereof drilled in said collar by said spindle,
   e. a registration pin received by said hole in said collar adapted for extending above the surface of said tooling plate on movement of said shaft, and
   f. a pneumatic cylinder having a piston and piston rod, mounted on said tooling plate operatively coupled to said shaft for selectively raising and lowering said shaft on energizing or de-energizing of said pneumatic cylinder.

7. A retractable registration apparatus for use with a numerically controlled machine tool having at least one spindle comprising:
   a. a tooling plate having an access hole mounted on said machine tool,
   b. a guide mounted in a fixed position relative to said tooling plate,
   c. a shaft slideably received by said guide,
   d. a soft collar adapted for removable attachment to said shaft, having a hole in the top thereof,
   e. a registration pin received by said hole in said collar adapted for extending above or below the surface of said tooling plate, and
   f. a pneumatic cylinder having a piston and a piston rod, wherein said piston rod is coupled to said shaft.

8. A retractable registration apparatus as described in claim 7 wherein said shaft may be selectively raised and lowered on energizing or de-energizing of said pneumatic cylinder.

9. A retractable registration apparatus for use with a numerically controlled machine tool having at least one spindle comprising:
   a. a tooling plate having an access hole mounted on said machine tool,
   b. a guide mounted in a fixed position relative to said tooling plate,
   c. a shaft slideably received by said guide,
   d. a soft collar adapted for removable attachment to said shaft, having a hole in the top thereof drilled by said spindle,
   e. a registration pin received by said hole in said collar adapted for extending above or below the surface of said tooling plate, and
   f. a pneumatic cylinder having a piston and a piston rod, said piston rod coupled to said shaft.

10. A retractable registration apparatus for use with a numerically controlled machine tool having at least one spindle comprising:
    a. a tooling plate having an access hole mounted on said machine tool,
    b. a guide mounted in a fixed position relative to said tooling plate,
    c. a shaft slideably received by said guide,
    d. a soft collar adapted for removable attachment to said shaft, having a hole in the top thereof,
    e. a registration pin received by said hole in said collar adapted for extending above or below the surface of said tooling plate, and
    f. a pneumatic cylinder having a piston and a piston rod, said piston rod coupled to said shaft.

11. A retractable registration apparatus for use with a numerically controlled machine tool having at least one spindle comprising:
    a. a tooling plate having an access hole mounted on said machine tool,
    b. a guide mounted in a fixed position relative to said tooling plate,
    c. a shaft slideably received by said guide adapted for selective linear motion relative to said guide,
    d. a soft collar adapted for removable attachment to said shaft, having a hole in the top thereof,
    e. a registration pin received by said hole in said collar adapted for extending above or below the surface of said tooling plate,
    f. a pneumatic cylinder having a piston and a piston rod, and
    g. a link coupling said piston rod to said shaft.

12. A retractable registration apparatus for use with a numerically controlled machine tool having at least one spindle comprising:
    a. a tooling plate having an access hole mounted on said machine tool,
    b. a guide mounted in a fixed position relative to said tooling plate,
    c. a shaft slideably received by said guide adapted for selective linear motion relative to said guide,
    d. a soft collar adapted for removable attachment to said shaft, having a hole in the top thereof,
    e. a registration pin received by said hole in said collar adapted for extending above or below the surface of said tooling plate,
    f. a pneumatic cylinder having a piston and a piston rod, and
    g. a link coupling said piston rod to said shaft through a non-influencing coupling.

* * * * *